(12) United States Patent
Arai

(10) Patent No.: US 9,400,423 B2
(45) Date of Patent: Jul. 26, 2016

(54) MANUFACTURING METHOD FOR PHOTOMASK

(71) Applicant: DISCO CORPORATION, Tokyo (JP)

(72) Inventor: Kazuhisa Arai, Tokyo (JP)

(73) Assignee: Disco Corporation, Tokyo (JP)

( * ) Notice: Subject to any disclaimer, the term of this patent is extended or adjusted under 35 U.S.C. 154(b) by 154 days.

(21) Appl. No.: 14/487,666

(22) Filed: Sep. 16, 2014

(65) Prior Publication Data

US 2015/0093688 A1 Apr. 2, 2015

(30) Foreign Application Priority Data

Oct. 1, 2013 (JP) .................................. 2013-206675

(51) Int. Cl.
*G03F 1/68* (2012.01)
(52) U.S. Cl.
CPC ........................................ *G03F 1/68* (2013.01)
(58) Field of Classification Search
CPC ........................................................ G03F 1/68
USPC ............................................................. 430/5
See application file for complete search history.

(56) References Cited

FOREIGN PATENT DOCUMENTS

JP 62-229151 10/1987
JP 2006-114825 4/2006

*Primary Examiner* — Christopher Young
(74) *Attorney, Agent, or Firm* — Greer Burns & Crain, Ltd.

(57) ABSTRACT

A manufacturing method for a photomask for wafer processing includes a step of forming a groove on the front side of a light shielding plate in an area where light is to be passed. The groove has a depth not reaching the back side of the light shielding plate. A uniting step applies a bonding agent capable of transmitting light to the front side of the light shielding plate after performing the groove forming step and next attaching a transparent plate through the bonding agent to the front side of the light shielding plate to thereby unite the light shielding plate and the transparent plate. A grinding step holds the transparent plate on a chuck table after performing the uniting step. The back side of the light shielding plate is ground until the groove is exposed to the back side of the light shielding plate.

3 Claims, 8 Drawing Sheets

MANUFACTURING METHOD FOR PHOTOMASK

BACKGROUND OF THE INVENTION

1. Field of the Invention

The present invention relates to a manufacturing method for a photomask for wafer processing.

2. Description of the Related Art

A plurality of devices such as ICs and LSIs are formed on the front side of a semiconductor wafer so as to be separated by a plurality of division lines. The back side of the semiconductor wafer is ground to reduce the thickness of the semiconductor wafer to a predetermined thickness. Thereafter, the semiconductor wafer is divided along the division lines by a dicing apparatus or a laser processing apparatus to thereby obtain the individual devices as chips. These devices are widely used in various electronic apparatuses such as mobile phones and personal computers. However, in the case of dicing the semiconductor wafer by using a dicing saw, a cutting blade is rotated at a high speed and fed into the division lines of the semiconductor wafer, causing a problem such that chipping may occur on the devices due to a crush force by the cutting blade, so that the die strength of each device may be reduced.

Further, in dicing the semiconductor wafer by using the cutting blade, it is necessary to accurately align the cutting blade with each division line and then cut each division line, so that this cutting operation is inefficient. Particularly in the case that the size of each device is small and the number of division lines is therefore large, much time is required to cut all of the division lines, causing a reduction in productivity. To improve the die strength of each device or improve the productivity, Japanese Patent Laid-Open No. 2006-114825 has proposed a technique of plasma-etching the division lines of a semiconductor wafer to thereby divide the wafer into the individual devices.

SUMMARY OF THE INVENTION

However, as disclosed in Japanese Patent Laid-Open No. 2006-114825, a photomask is required in plasma-etching the division lines to divide the wafer into the individual devices. The existing photomask is expensive to cause a cost increase, resulting in a reduction in productivity.

An existing manufacturing method for a photomask is disclosed in Japanese Patent Laid-Open No. Sho 62-229151, for example. This manufacturing method includes the steps of covering the front side of a glass plate with a light shielding film formed of chromium, covering the upper surface of the light shielding film with a photoresist film, selectively irradiating the photoresist film between a light shielding area and a light transmitting area thereof with light or electron beam to thereby draw a pattern, developing the photoresist film to partially remove the photoresist film, and etching the light shielding film to partially remove the light shielding film. Thus, the steps of the manufacturing method are complicated to cause an increase in cost for the photomask.

It is therefore an object of the present invention to provide a manufacturing method for a photomask for wafer processing which can manufacture the photomask easily at a low cost.

In accordance with an aspect of the present invention, there is provided a manufacturing method for a photomask for wafer processing, including a preparing step of preparing a transparent plate for transmitting light and a light shielding plate for shielding light, each of the transparent plate and the light shielding plate having a size equal to or greater than that of a wafer to be processed; a groove forming step of forming a groove on the front side of the light shielding plate in an area where light is to be passed, the groove having a depth not reaching the back side of the light shielding plate; a uniting step of applying a bonding agent capable of transmitting light to the front side of the light shielding plate after performing the groove forming step and next attaching the transparent plate through the bonding agent to the front side of the light shielding plate to thereby unite the light shielding plate and the transparent plate; and a grinding step of holding the transparent plate on a chuck table after performing the uniting step and next grinding the back side of the light shielding plate until the groove is exposed to the back side of the light shielding plate.

Preferably, a plurality of crossing division lines are formed on the front side of the wafer to define a plurality of separate regions where a plurality of devices are formed; and the groove is formed in an area corresponding to each of the division lines of the wafer in the groove forming step.

According to the manufacturing method of the present invention as described above, it is possible to eliminate the need for the existing complicated and costly steps and the photomask for wafer processing can be easily manufactured by performing the simple steps, thereby improving the productivity.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
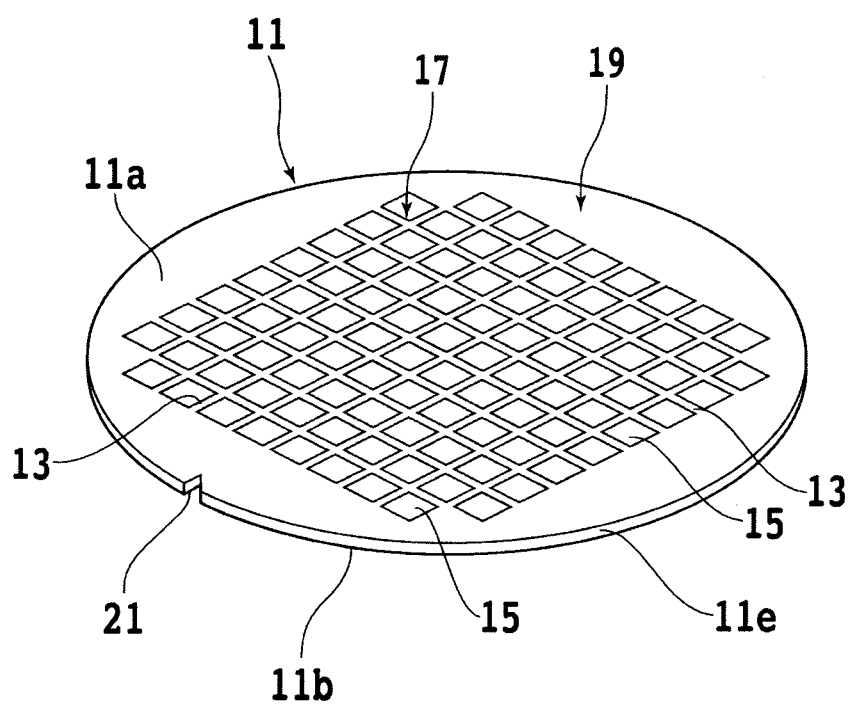
FIG. 1 is a perspective view of a semiconductor wafer, showing the front side thereof.

A preferred embodiment of the present invention will now be described in detail with reference to the drawings. Referring to FIG. 1, there is shown a perspective view of a semiconductor wafer (which will be hereinafter referred to also simply as wafer) 11 as viewed from a front side 11a thereof. The semiconductor wafer 11 is a silicon wafer having a thickness of 700 μm, for example. A plurality of crossing division lines 13 are formed on the front side 11a of the semiconductor wafer 11 to thereby define a plurality of separate regions where a plurality of devices 15 such as ICs and LSIs are formed.

The front side 11a of the semiconductor wafer 11 is a flat portion, and it includes a device area 17 where the plural devices 15 are formed and a peripheral marginal area 19 surrounding the device area 17. The outer circumference of the semiconductor wafer 11 is chamfered to form an arcuate chamfered portion 11e. Reference numeral 21 denotes a notch as a mark for indicating the crystal orientation of the silicon wafer.

Figure 2A:
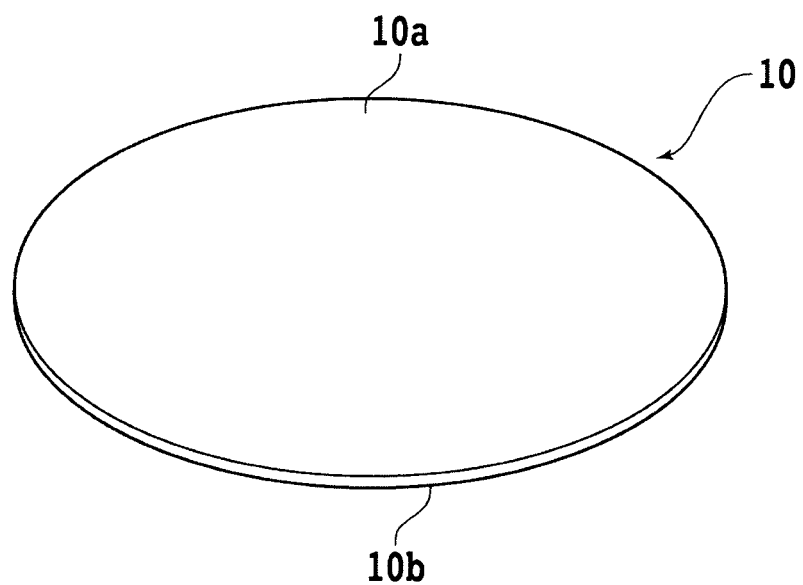
FIG. 2A is a perspective view of a light shielding plate.
Figure 2B:
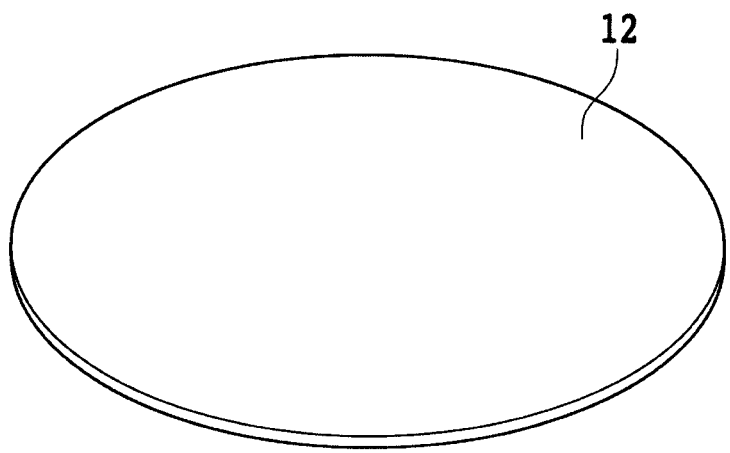
FIG. 2B is a perspective view of a transparent plate.

In the photomask manufacturing method according to the present invention, a preparing step is performed to prepare a light shielding plate 10 for shielding light as shown in FIG. 2A and a transparent plate 12 for transmitting light as shown in FIG. 2B. The light shielding plate 10 shown in FIG. 2A is a silicon wafer having no pattern, for example, and it has a front side 10a and a back side 10b. On the other hand, the transparent plate 12 shown in FIG. 2B is formed of glass, quartz, or PET (polyethylene terephthalate), for example. Each of the light shielding plate 10 and the transparent plate 12 has a size equal to or greater than that of the semiconductor wafer 11 shown in FIG. 1.

Figure 3A:
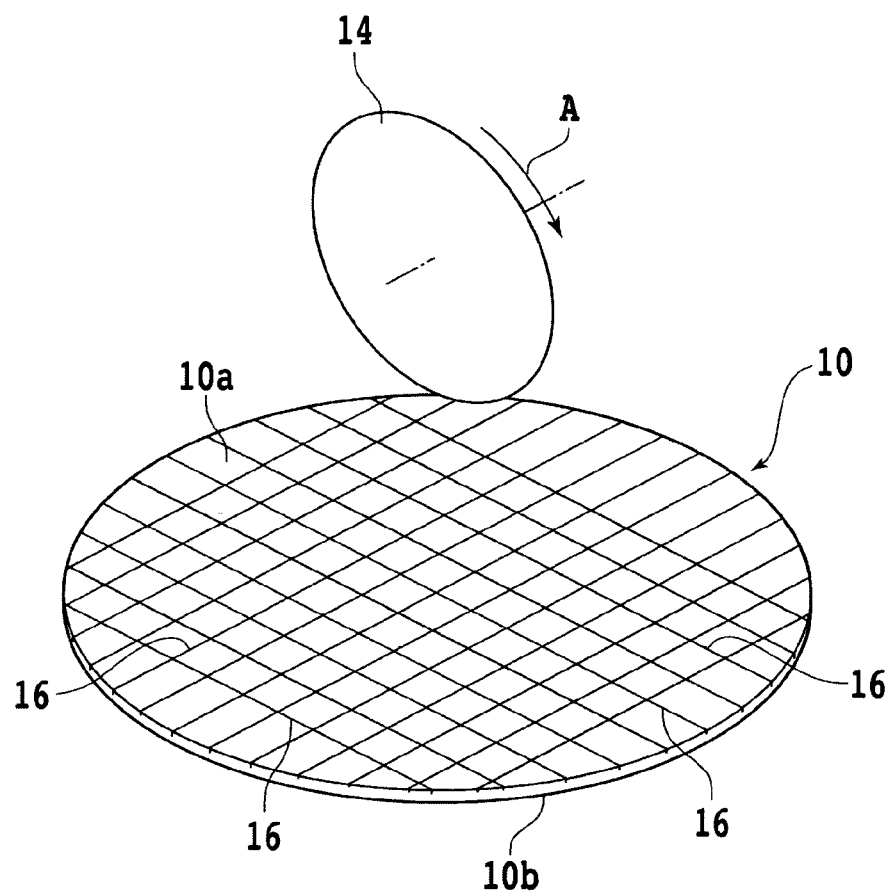
FIG. 3A is a schematic view showing a groove forming step.
Figure 3B:
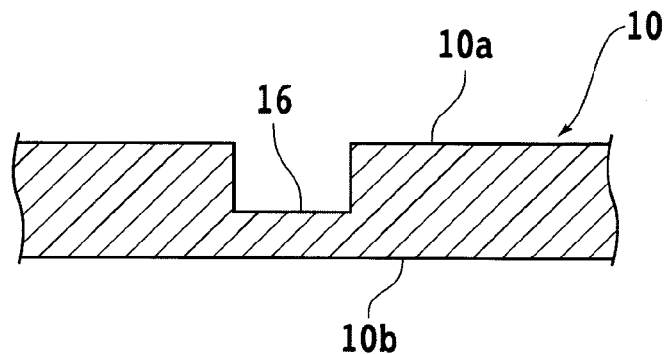
FIG. 3B is an enlarged sectional view of an essential part of the light shielding plate, showing a groove formed by the groove forming step shown in FIG. 3A.

Referring to FIG. 3A, there is shown a schematic view for illustrating a manner of forming a plurality of grooves 16 on the front side 10a of the light shielding plate 10 (groove forming step). In this groove forming step, each groove 16 having a depth not reaching the back side 10b of the light shielding plate 10 as shown in FIG. 3B is formed on the front side 10a of the light shielding plate 10 in an area where light is to be passed. Preferably, the groove forming step is performed by rotating a cutting blade 14 at a high speed in the direction shown by an arrow A in FIG. 3A and feeding the cutting blade 14 into the light shielding plate 10 from the front side 10a thereof. The plural grooves 16 are formed on the front side 10a of the light shielding plate 10 in the areas corresponding to the division lines 13 of the semiconductor wafer 11 shown in FIG. 1.

The pitch of the grooves 16 adjacent to each other is equal to the pitch of the division lines 13 adjacent to each other. The plural grooves 16 extending in a first direction are first formed with the same pitch as that of the division lines 13 extending in the first direction, and the remaining grooves 16 extending in a second direction perpendicular to the first direction are next formed with the same pitch as that of the remaining division lines 13 extending in the second direction.

Figure 4:
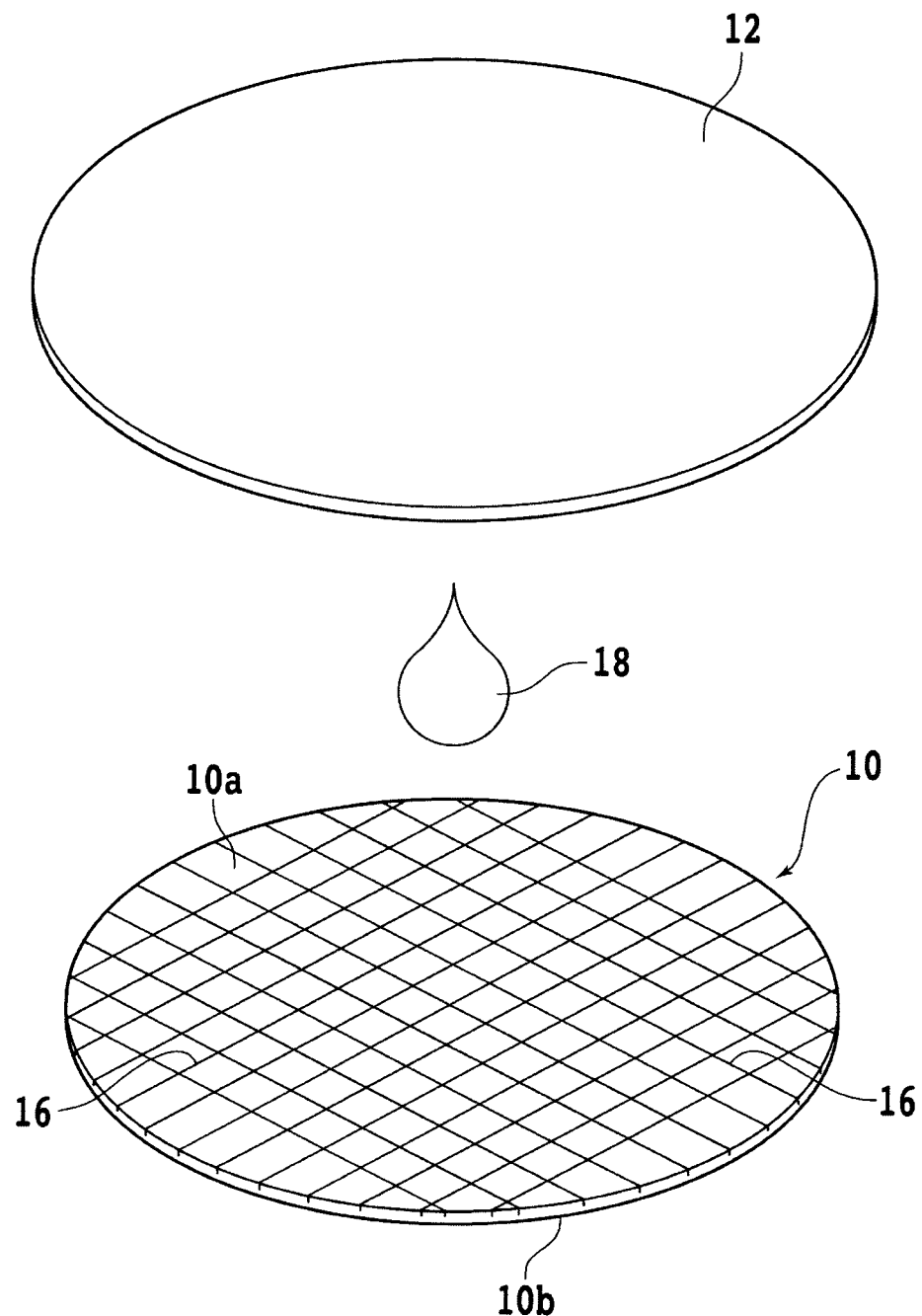
FIG. 4 is a perspective view showing a uniting step of uniting the light shielding plate and the transparent plate.
Figure 5:
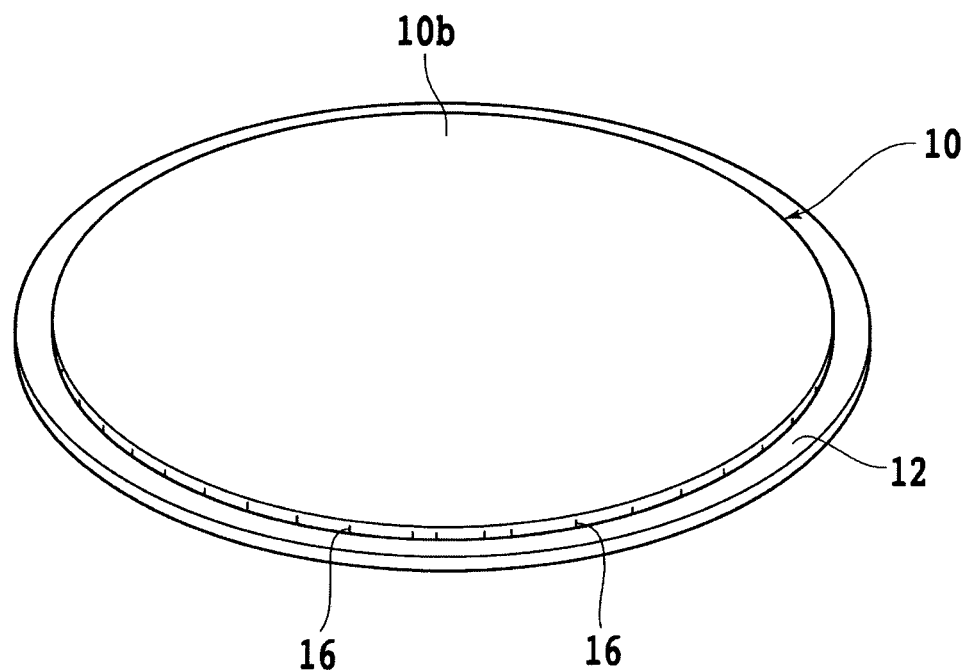
FIG. 5 is a perspective view showing a condition that the transparent plate and the light shielding plate have been united together by the uniting step shown in FIG. 4.

After performing the groove forming step as mentioned above, a bonding agent 18 capable of transmitting light is applied to the front side 10a of the light shielding plate 10 and the transparent plate 12 is next attached through the bonding agent 18 to the front side 10a of the light shielding plate 10 as shown in FIG. 4 (uniting step). Referring to FIG. 5, there is shown a perspective view of the light shielding plate 10 and the transparent plate 12 united together by performing the uniting step mentioned above. In the condition shown in FIG. 5, the back side 10b of the light shielding plate 10 is exposed.

Figure 6:
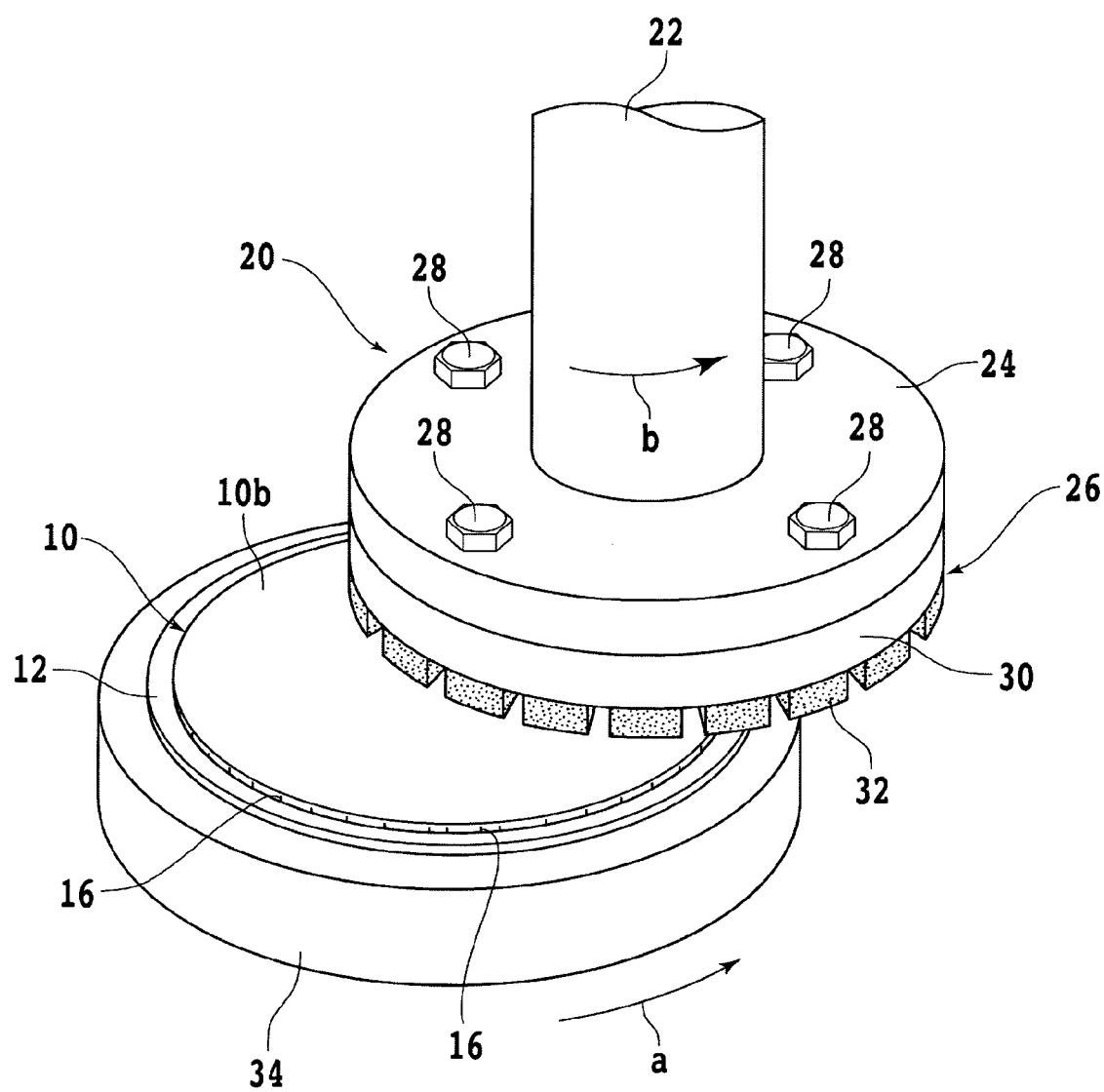
FIG. 6 is a perspective view showing a grinding step.

After performing the uniting step mentioned above, a grinding step is performed to grind the back side 10b of the light shielding plate 10 until the grooves 16 are exposed to the back side 10b. This grinding step is performed by using a grinding unit 20 shown in FIG. 6. The grinding unit 20 is included in a grinding apparatus (not shown). As shown in FIG. 6, the grinding unit 20 includes a spindle 22 adapted to be rotationally driven, a wheel mount 24 fixed to the lower end of the spindle 22, and a grinding wheel 26 detachably mounted on the lower surface of the wheel mount 24 by a plurality of screws 28. The grinding wheel 26 is composed of an annular wheel base 30 and a plurality of abrasive members 32 fixed to the lower surface of the annular wheel base 30 so as to be annularly arranged at given intervals.

The grinding apparatus further includes a chuck table 34 for holding the unit of the light shielding plate 10 and the transparent plate 12 under suction. As shown in FIG. 6, the unit of the light shielding plate 10 and the transparent plate 12 is held on the chuck table 34 under suction in the condition where the transparent plate 12 is in contact with the chuck table 34 and the back side 10b of the light shielding plate 10 is exposed. Thereafter, the chuck table 34 is rotated in the direction shown by an arrow a in FIG. 6 at 300 rpm, for example, and the grinding wheel 26 is also rotated in the same direction as the rotational direction of the chuck table 34, i.e., in the direction shown by an arrow b in FIG. 6 at 6000 rpm, for example. Further, a grinding unit feeding mechanism (not shown) is operated to bring the abrasive members 32 of the grinding wheel 26 into contact with the back side 10b of the light shielding plate 10.

Figure 7:
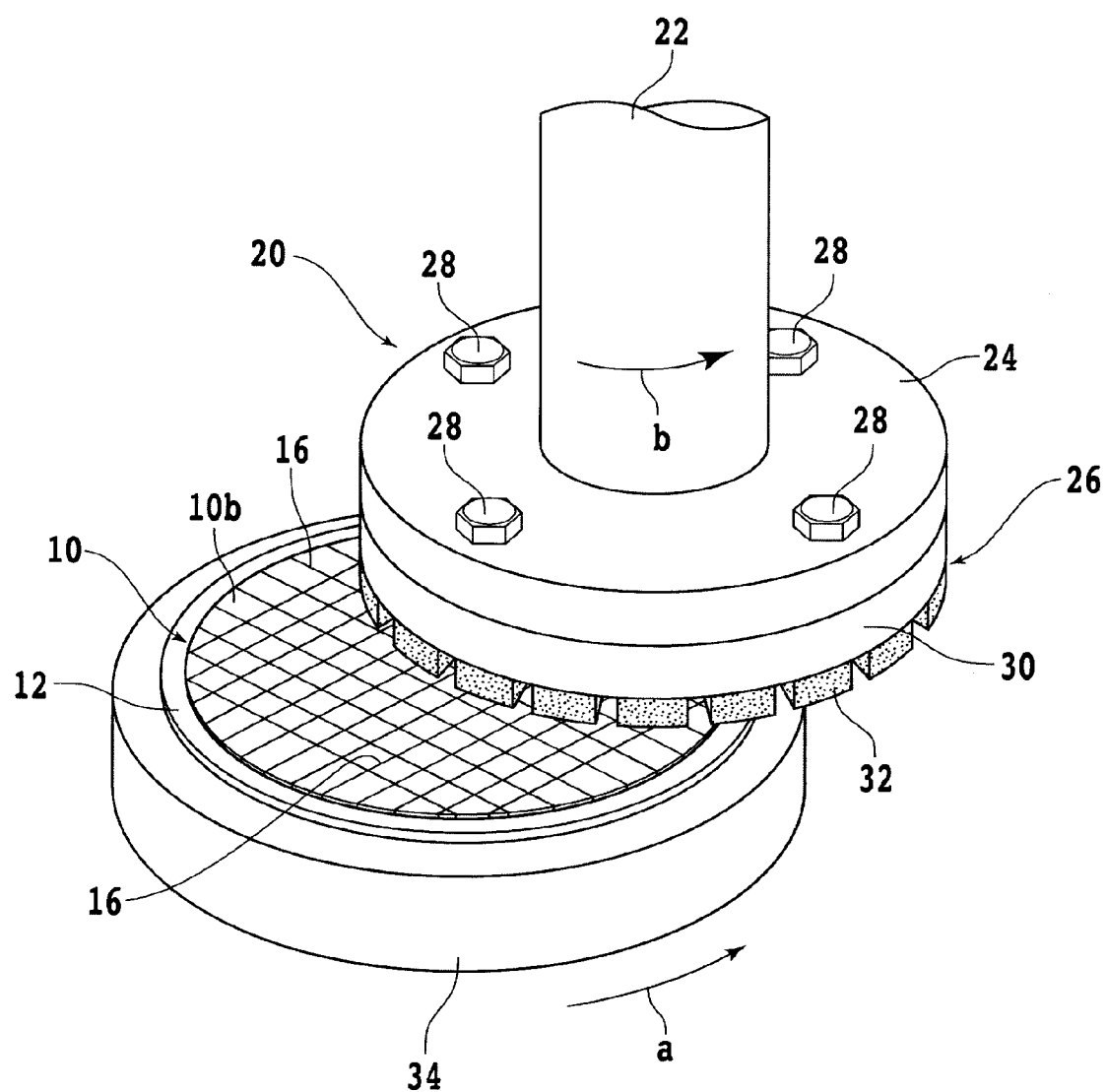
FIG. 7 is a perspective view showing a condition that the grooves formed on the front side of the light shielding plate have been exposed to the back side of the light shielding plate by the grinding step shown in FIG. 6.
Figure 8:
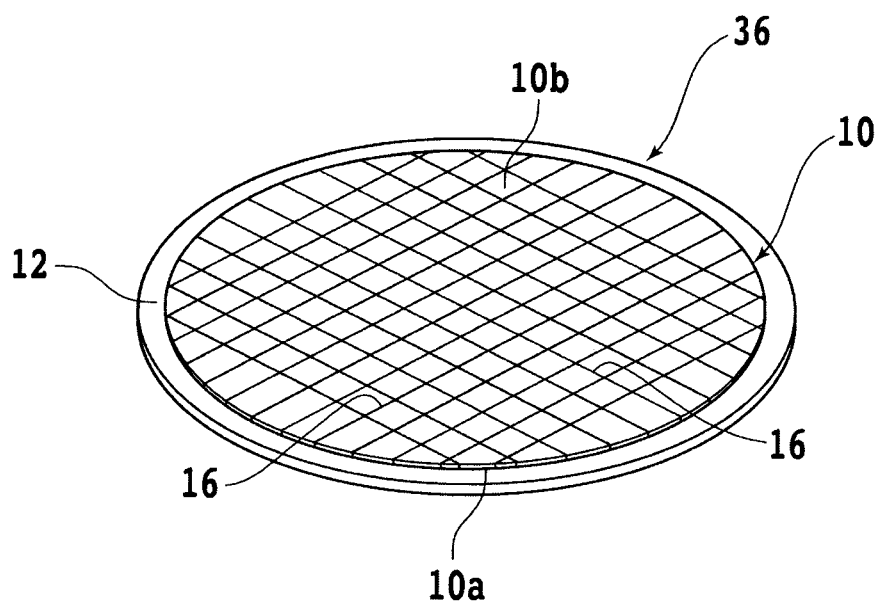
FIG. 8 is a perspective view of a photomask for wafer processing as obtained by the manufacturing method according to the present invention.

Thereafter, the grinding wheel 26 is fed downward by a predetermined amount at a predetermined feed speed, thereby grinding the back side 10b of the light shielding plate 10. As a result, the grooves 16 formed on the front side 10a of the light shielding plate 10 is exposed to the back side 10b of the light shielding plate 10 as shown in FIG. 7. When all of the grooves 16 are exposed to the back side 10b of the light shielding plate 10, the grinding step is stopped. As a result, a photomask 36 for wafer processing as shown in FIG. 8 can be manufactured. In the photomask 36, the plural grooves 16 are formed on the light shielding plate 10 bonded to the transparent plate 12 (each groove 16 having a depth equal to the thickness of the light shielding plate 10 processed by the grinding step) at the positions corresponding to the plural division lines 13 of the semiconductor wafer 11 shown in FIG. 1. Accordingly, the photomask 36 can be used as a photomask such that light is allowed to pass through the area corresponding to the grooves 16 of the light shielding plate 10 and shielded in the other area.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A manufacturing method for a photomask for wafer processing, comprising:

a preparing step of preparing a transparent plate for transmitting light and a light shielding plate for shielding light, each of said transparent plate and said light shielding plate having a size equal to or greater than that of a wafer to be processed;

a groove forming step of forming a groove on a front side of said light shielding plate in an area where light is to be passed, said groove having a depth not reaching a back side of said light shielding plate;

a uniting step of applying a bonding agent capable of transmitting light to the front side of said light shielding plate after performing said groove forming step and next attaching said transparent plate through said bonding agent to the front side of said light shielding plate to thereby unite said light shielding plate and said transparent plate; and a grinding step of holding said transparent plate on a chuck table after performing said uniting step and next grinding the back side of said light shielding plate until said groove is exposed to the back side of said light shielding plate.

2. The manufacturing method according to claim 1, wherein a plurality of crossing division lines are formed on a front side of said wafer to define a plurality of separate regions where a plurality of devices are formed; and
said groove is formed in an area corresponding to each of said division lines of said wafer in said groove forming step.

3. The manufacturing method according to claim 2, wherein said groove forming step is performed by using a cutting blade adapted to be rotatably driven.

\* \* \* \* \*